(12) United States Patent
Au

(10) Patent No.: US 6,646,578 B1
(45) Date of Patent: Nov. 11, 2003

(54) CONTEXT ADAPTIVE VARIABLE LENGTH DECODING SYSTEM AND METHOD

(75) Inventor: James Au, Port Coquitlam (CA)

(73) Assignee: UB Video Inc., Vancouver (CA)

( * ) Notice: Subject to any disclaimer, the term of this patent is extended or adjusted under 35 U.S.C. 154(b) by 0 days.

(21) Appl. No.: 10/301,652

(22) Filed: Nov. 22, 2002

(51) Int. Cl.$^7$ ............................................. H03M 7/40
(52) U.S. Cl. ........................ 341/67; 382/246; 371/37.01
(58) Field of Search ........................ 341/67, 106, 143, 341/60, 63; 382/246; 348/403

(56) References Cited

U.S. PATENT DOCUMENTS

| | | | | |
|---|---|---|---|---|
| 5,781,561 | A | * 7/1998 | Machida et al. | 714/752 |
| 5,852,469 | A | * 12/1998 | Nagai et al. | 375/240.23 |
| 6,014,095 | A | * 1/2000 | Yokoyama | 341/67 |
| 6,414,608 | B1 | * 7/2002 | Nishida et al. | 341/67 |
| 2001/0033697 | A1 | * 10/2001 | Shimada | 382/246 |

* cited by examiner

*Primary Examiner*—Brian Young
*Assistant Examiner*—John Nguyen
(74) *Attorney, Agent, or Firm*—John R. S. Drange; Santosh K. Chari (57) ABSTRACT

A system and method to perform context-adaptive variable length decoding (CAVLC) of transform coefficient levels for block-based motion-compensated decoding of moving pictures, corresponding to transform coefficients. The system and method includes complexity-reduction improvements in the coefficient level decoding process, such as simplified and extended range of Lev-VLC tables. Specifically, the number of Lev-VLC tables is extended from 5 to 7 and only 1 escape code (28-bit escape code) is used for tables Lev-VLC1 to Lev-VLC6. The system and method also includes a simplified and improved table selection process. The table selection for the first Coefficient_ level after trailing ones depends on total number of non-zero coefficients and number of trailing ones which are local variables within the CAVLC module. The table selection process for subsequent Coefficient_level's has been re-designed in such a way that the same logic path can be used to select Lev-VLC table for the next coefficient regardless of block modes and quantization parameters.

23 Claims, 7 Drawing Sheets

CONTEXT ADAPTIVE VARIABLE LENGTH DECODING SYSTEM AND METHOD

BACKGROUND OF THE INVENTION

1. Field of the Invention

The present invention relates to a system and method for context adaptive entropy decoding of transform coefficients in compressed video images.

2. Description of the Prior Art

There is an increasing reliance on video data in rich media applications running on devices or systems such as personal computers, wireless devices, surveillance systems, video conferencing system and set-top boxes. Video data compression system play a key role in increasing the efficiency of video data transmission. Video data is compressed or coded for transmission by taking advantage of the spatial redundancies within a given frame and the temporal redundancies between successive frames. Intraframe compression operates on single frames independently of other frames to exploit spatial redundancies within the frame, whereas interframe compression exploits both spatial and temporal redundancies.

Video compression systems exploit temporal redundancies using interframe prediction coding. Interframe coding is based on predicting the current source frame using the previously coded frame, and coding only the prediction error between the source frame and the predicted frame. Approximations are done in the prediction process, by assuming the motion is uniform across all pixels of each motion estimation block in each frame. It is noted that intercoding can be done for both uni-directional and bidirectional prediction. Transmission efficiencies are realised in intercoding by transmitting the prediction error, as the amount of information present in the prediction error is generally less than that in the actual pixel values. The resulting prediction residuals from inter coding are processed through a frequency domain transform and a quantizer that sets the values of the transform coefficients to discrete values within a pre-specified range. Further compression of the video information is realized by entropy coding the resulting quantized transform coefficients before transmission or storage of the encoded bit stream. The entropy coder is used to represent the resulting information from the quantizer, the motion vector information, and other encoder information using short code words to code the information with the highest likely probability of occurrence, and long code words to code the information with the least likely probability of occurrence. The general approach to code the information with the highest likely probability of occurrence using short code words and the information with the least likely probability of occurrence using long code words is referred to as Variable Length Coding.

Since the video data is transmitted or stored in the form of a compressed bitstream, a decoder is needed to decode the bitstream to reconstruct the video data. First the decoder performs entropy variable-length-decoding of the quantized coefficients, then performs inverse quantization and inverse transform operations to form the image difference pixel values. Finally the image difference values are added to the image prediction pixel values to form the final reconstructed image pixels values.

As an example of entropy coding and decoding of transform coefficients, consider the case of entropy coding/decoding specified in the H.264 video coding standard. In H.264, entropy decoding of coefficients is done on a 4×4 block basis. As an illustrative example, consider the following 4×4 block of quantized transform coefficients at the encoder.

| 6 | 0  | 0 | 0 |
|---|----|---|---|
| 5 | −4 | 0 | 0 |
| 0 | 3  | 0 | 0 |
| 0 | −1 | 1 | 0 |

The first step in the encoding process for the above 4×4 quantized transform coefficients is to apply a zigzag scan to the above quantized transform coefficient block to produce a sequence of coefficients. The zigzag scan is performed according to the following diagram:

The resulting series of coefficients is then 6, 0, 5, 0, −4, 0, 0, 0, 3, 0, −1, 0, 0, 0, 1, 0. The coefficients are typically grouped into (Run_before, Coefficient_level) pairs where Run_before is the number of consecutive zero coefficients preceding a non-zero coefficients in the resulting zigzag order from low frequency coefficients to high frequency coefficients, and Coefficient_level is the value of the non-zero coefficients. The resulting (Run_before, Coefficient_level) pairs are then (0,6) (1,5), (1,−4), (3,3), (1,−1) and (3,1). In H.264, the Run_before information is separated from the Coefficient_level information and each is placed in a separate sequence. The resulting Run_before and Coefficient_level sequences are then:

Run_before: 6, 5, −4, 3,−1, 1

Coefficient_level: 0, 1, 1, 3, 1, 3

The second step in the coding process is to encode the Run_before information and the Coefficient_level information to produce the bit stream corresponding to the original quantized 4×4 transform coefficient data.

At the decoder side, the step in the entropy decoding process for the coded quantized transform coefficient data is to decode the bitstream generated by the encoder to produce the Run_before information and the Coefficient_level information. For the example discussed above, this first step in the decoding process results in the following two sequences:

Run_before: 6, 5, −4, 3, −1, 1

Coefficient_level: 0, 1, 1, 3, 1, 3

The second step in the decoding process is to use the zigzag scan order described above to recover the 4×4 block of quantized transform coefficients based on the above two sequences.

When the video data is transmitted at medium to high bit rates, the bits used to represent Run_before and Coefficient_levels dominate the compressed bit stream. It is therefore desirable to compress the Run_before and Coefficient_level information in the most efficient way. In a typical variable-length decoding system, each Run_before symbol and Coefficient_level symbol would be associated with a unique variable-length codeword such that frequently-occurring symbols have shorter lengths and rarely-occurring symbols have longer lengths. However, since different types of video content and different bit rates usually lead to different statistics of the 4×4 transform coefficient data, a fixed mapping of Run_before and Coefficient_level symbols and variable legth codewords may not always provide optimal entropy compression. To solve this problem, context-adaptive variable length coding (CAVLC) schemes were developed so that the entropy coding process can adapt to different data statistics and always produce good entropy compression.

One of the known prior art CAVLC methods is described in a document "Committee Draft" by the Joint Video Team (JVT) of ISO/IEC MPEG and ITU-T VCEG. The H.264 standard specifies the use of context-adaptive variable length coding (CAVLC) in order to entropy decode the quantized transform coefficients information. Briefly, the method decodes the Coefficient_levels and Run_before using multiple variable-length decoding tables where a table is selected to decode each symbol based on the context of previously decoded symbols. One important aspect of the method is that the Coefficient_level and Run_before sequences are decoded in backward order, i.e. from coefficients corresponding to high frequencies to coefficients corresponding to low frequencies. For the example described above, the original scan order (from low frequency to high frequency) is given by Coefficient_level: 6, 5, −4, 3, −1, 1

Run_before: 0, 1, 1, 3, 1, 3 whereas the CAVLC bitstream's order is given by:

Coefficient_level: 1, −1, 3, −4, 5, 6

Run_before: 3, 1, 3, 0, 1, 1

It was observed that the CAVLC ordering of the coefficient values the coefficient_level sequences often results in a number of coefficients at the beginning of the sequence with absolute value equal to 1. Consecutive coefficients starting with the first coefficient in the sequence and with absolute value of 1 are called trailing ones (T1s). At most 3 trailing ones could be considered. The presence of the T1s in the Coefficient_level sequence is used to further enhance the compression efficiency in the CAVLC method, as described in the sections below.

CAVLC decoding of transform coefficients is based on 4 main steps. In the first step, the total number of non-zero coefficients and the number of trailing ones (T1s) are decoded from the bit stream, where the total number of trailing ones indicates the number of consecutive Coefficient_levels with absolute values of one at the end of the Coefficient_level sequence within the last three Coefficient_levels.

In the second step, the sign bits of the trailing ones (up to 3) are decoded using 1 bit each. The sign bits are enough to decode the Coefficient_levels of the trailing ones.

In the third step, the rest of the Coefficient_levels are decoded using 5 different VLC tables with names Lev-VLC0, Lev-VLC1, Lev-VLC2, Lev-VLC3, and Lev-VLC4, and an adaptive table selection scheme. Each x in the tables below can take the value of either 0 or 1.

| Code no | Bit stream codeword | Coefficient Level |
|---|---|---|
| | Lev-VLC0 | |
| 0 | 1 | 1 |
| 01 | 01 | −1 |
| 2 | 001 | 2 |
| 3 | 0001 | −2 |
| ... | ... | ... |
| 13 | 00000000000001 | −7 |
| 14–29 | 000000000000001xxxx | ±8 to ±15 |
| 30—> | 0000000000000001xxxxxxxxxxxx | ±16—> |
| | Lev-VLC1 | |
| 0–1 | 1x | ±1 |
| 2–3 | 01x | ±2 |
| ... | ... | ... |
| 26–27 | 00000000000001x | ±14 |
| 28–43 | 000000000000001xxxx | ±15 to ±22 |
| 44—> | 0000000000000001xxxxxxxxxxxx | ±23—> |
| | Lev-VLC2 | |
| 0–3 | 1xx | ±1 to ±2 |
| 4–7 | 01xx | ±3 to ±4 |
| ... | ... | ... |
| 52–55 | 00000000000001xx | ±27 to ±28 |
| 56–71 | 000000000000001xxxx | ±29 to ±36 |
| 72—> | 0000000000000001xxxxxxxxxxxx | ±37—> |
| | Lev-VLC3 | |
| 0–7 | 1xxx | ±1 to ±4 |
| 8–16 | 01xxx | ±5 to ±8 |
| ... | ... | ... |
| 104–111 | 00000000000001xxx | ±53 to ±56 |
| 112–127 | 000000000000001xxxx | ±57 to ±64 |
| 128—> | 0000000000000001xxxxxxxxxxxx | ±66—> |
| | Lev-VLC4 | |
| 0–15 | 1xxxx | ±1 to ±8 |
| 16–31 | 01xxxx | ±9 to ±16 |
| ... | ... | ... |
| 224–239 | 000000000000001xxxx | ±113 to ±120 |
| 240—> | 0000000000000001xxxxxxxxxxxx | ±121—> |

The third step is called the Coefficient_level decoding process. Accordingly, for the first Coefficient_level in the Coefficient_level sequence, a Lev-VLC table is selected based on the block type (inter-coded or intra-coded), quantization parameter (QP), and total number of non-zero coefficients. For the rest of the Coefficient_levels, a table is selected to decode each Coefficient_level based on the block type, quantization parameters, and the Coefficient_level of the previously decoded Coefficient_level. The exact algorithm is as follows:

If block is Inter-coded or (Intra-coded with QP>=21):
    Decode the first coefficient after trailing ones with Lev-VLC0 table. Decode the
    next coefficient with Lev-VLC1.
    if previous Coefficient_level|>3
        Increase Lev-VLCN by one (up to Lev-VLC2)
If block is Intra-coded with QP<21:
    if (number of coefficients>10)
        Decode the first coefficient after trailing ones with Lev-VLC1 table.
        Decode the next coefficient with Lev-VLC2 table.
    else
        Decode the first coefficient after trailing ones with Lev-VLC0 table.
        Decode the next coefficient with the Lev-VLC1 table.
    if current table is Lev-VLC1 and |decoded Coefficient_level|>3
        use Lev-VLC2 for next Coefficient_level
    if current table is>=Lev-VLC2 and |decoded Coefficient_level|>5
        Increase Lev-VLCN by one (up to Lev-VLC4)

In other words, the most recently decoded Coefficient_level is used to predict what the next coefficient level may be and the most appropriate VLC table is selected based on the prediction. When decoding the first Coefficient_level (after trailing ones) and the number of trailing ones is less than three, the decoded Coefficient_level is the received level plus one.

In the fourth step, first the sum of Run_before is decoded, then multiple tables are used to decode each Run_before.

The major disadvantage of the existing method is that its complexity is high. Notice that there are two discontinuities (19-bit and 28-bit escape code sequences) in each of the Lev-VLC tables. The two discontinuities correspond to conditional execution branching and creates complexity for both software and hardware implementations. Furthermore, depending on the current block coding mode, quantization parameter, and total number of coefficients, three separate logic paths or circuits (Intercoded blocks and Intracoded blocks with QP>=21; Intracoded blocks with QP<21 and more than 10 nonzero coefficients; Intracoded blocks with QP<21 and the number of nonzero coefficients less than or equal to 10) are required to implement the table selection process. The discontinuities in the Lev-VLC tables and the multiple logic paths in the table selection process introduce a relatively large number of conditional instructions or branches that can significantly reduce the amount of parallelism in a typical processor or circuit. When there are many coefficients to be decoded (at medium to high bit rates), this can cause a significant slowdown in the speed of a decoder. For most DSP platforms, it is important that there be minimal or no branches inside the entropy decoding loop so that a software pipelining schedule can be utilized to exploit the parallel processing power of the DSPs.

Further, existing context adaptive variable length coding compression systems also select the decoding table for the first coefficient level after the trailing ones based on whether the current block is Inter mode or Intra mode, as well as what quantization parameter was used. Both of these parameters are external to the entropy decoding module, and therefore introduce inefficient data dependencies and increased data loading times. Further, the existing systems use different processing of Inter mode blocks and Intra mode blocks, which can increase code size and function set-up time, further impacting processing speed and memory requirements.

It is an object of the present invention to provide an entropy decoding system and method to obviate or mitigate some of the above-presented disadvantages.

SUMMARY OF THE INVENTION

According to the present invention there is provided a Context Adaptive Variable Length Coding (CAVLC) system and method to decode Coefficient level information corresponding to quantized transform coefficients. The system and method include complexity-reduction improvements in the coefficient level decoding process, such as:

1. Simplified and extended the range of Lev-VLC tables. Specifically, the number of Lev-VLC tables is extended from 5 to 7 and only 1 escape code (28-bit escape code) is used for tables Lev-VLC1 to Lev-VLC6; and
2. Simplified and improved table selection process. The table selection for the first Coefficient_level depends only on number of non-zero coefficients and number of trailing ones which are local variables within the CAVLC module. The table selection process for subsequent Coefficient_levels has been re-designed in such a way that the same logic path can be used to select Lev-VLC table for the next coefficient regardless of block modes and quantization parameters.

According to a further aspect of the present invention there is provided a Context-Adaptive Variable Length Coding (CAVLC) system for decoding quantized transform coefficient levels. The system comprises: an input for a bitstream including context-adaptive variable-length-encoded Run_before and Coefficient_level data corresponding to quantized transform coefficients; an entropy decoding section for decoding the Run_before and Coefficient_level data; and a plurality of decoding tables used by the entropy decoding section for decoding the data, wherein at least two of the decoding tables have a single escape sequence and are generated by a common function.

According to a further aspect of the present invention there is provided a Context-Adaptive Variable Length Coding (CAVLC) method for decoding quantized transform coefficient levels. The method comprises the steps of: receiving a bitstream including context-adaptive variable-length-encoded Run_before and Coefficient_level data corresponding to quantized transform coefficients; accessing a plurality of decoding tables for decoding the data, wherein at least two of the decoding tables have a single escape sequence and are generated by a common function; and selecting one of the plurality of tables for decoding the Run_before and Coefficient_level data.

According to a still further aspect of the present invention there is provided a Context-Adaptive Variable Length Coding (CAVLC) system for decoding quantised transform coefficient levels. The system comprises: an input for a bitstream including context-adaptive variable-length-encoded Run_before and Coefficient_level data corresponding to quantized transform coefficients; an entropy decoding section for decoding the Run_before and Coefficient_level data; and a plurality of decoding tables used by the entropy coding section for decoding Coefficient_levels, at least two of the decoding tables have a single escape sequence and are generated by a common function; wherein selection from the plurality of decoding tables for the first Coefficient_level is determined solely by local variables representing a total number of non-zero coefficients and a number of trailing ones in the sequence of Coefficient_levels and selection from the plurality of decoding tables for subsequent Coefficient_levels is determined solely by a previous decoded coefficient_level and an experimentally pre-determined table.

BRIEF DESCRIPTION OF THE DRAWINGS

These and other features of the preferred embodiments of the invention will become more apparent in the following detailed description in which reference is made to the appended drawings wherein.

DESCRIPTION OF THE PREFERRED EMBODIMENTS

Figure 1:
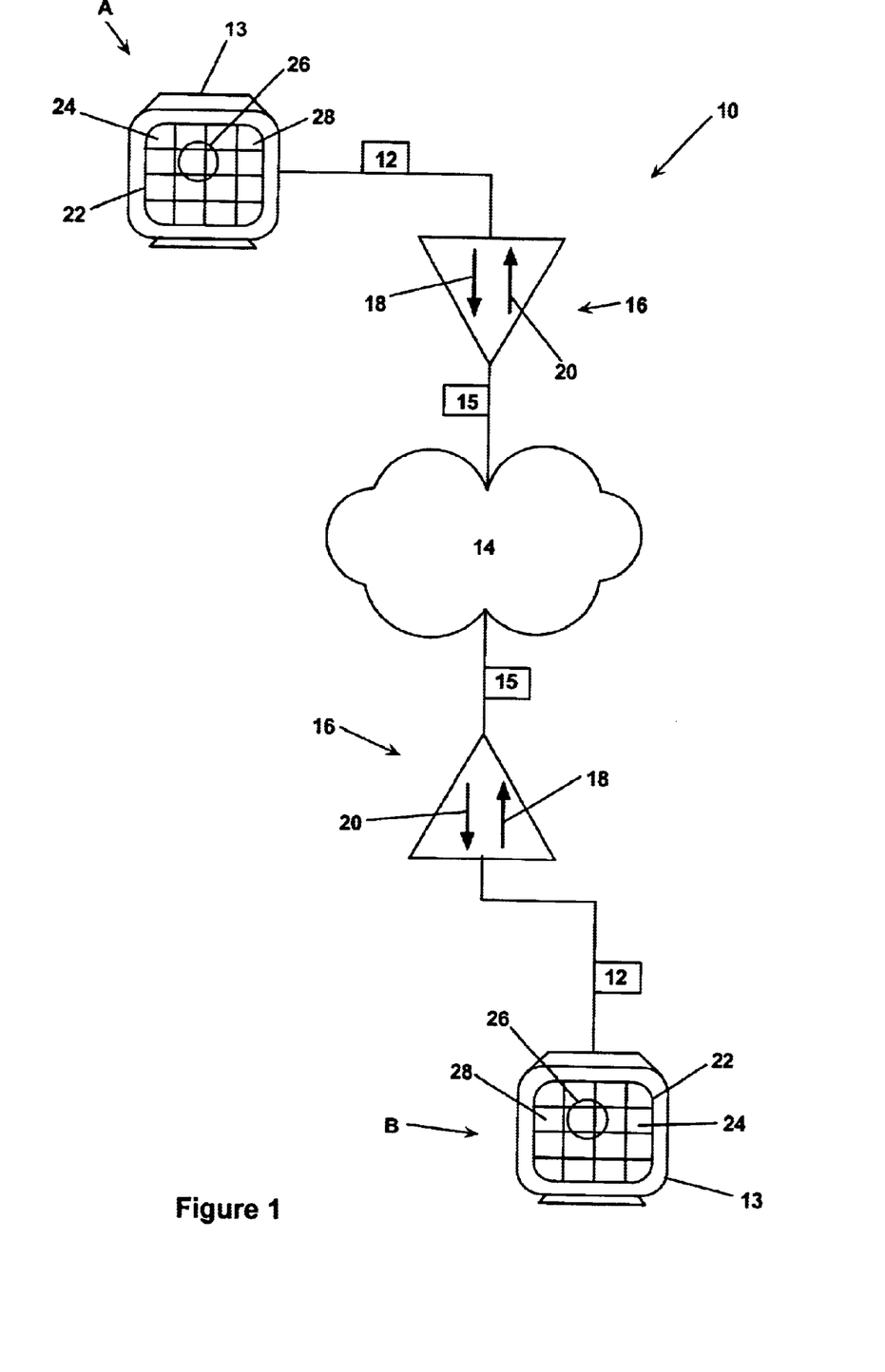
FIG. 1 is a diagram of an encoding/decoding system.

Referring to FIG. 1, such as but not limited to, a video conferencing system 10 has participants A and B that exchange video data 12 between monitors 13, formatted as a compressed bit stream 15 over a network 14 (such as but not limited to the Internet). Each participants A and B that exchange video data 12 between monitors 13, formatted as a data 12 and a decoder 20 for decoding the received bit stream 15. Each image frame 22 displayed on the monitors 13 is made of a series of macroblocks 24, such as but not limited to a block of 16×16 pixels, representing an object 26 which move over a background 28 (for example a person giving a presentation while standing in front of a backdrop). Accordingly, the processors 16 coordinate the display of successive frames 22 on the monitors 13, as the video data 12 is communicated between the participants A, B during a video conference. It is processors 16 coordinate the display of successive frames 22 on the monitors 13, as the video exchange of video data 12 in the compressed bit stream 15. It will be recognised that the system 10 may also involve the exchange of video data 12 in the compressed bit stream 15 in either one direction or both and on peer to peer basis or broadcast, as well as used in personal computers, wireless devices, surveillance systems, video conferencing systems and set-top boxes. In addition, the transfer of the compressed bit stream 15 through the encoder 18 and decoder 20 could be to a storage device (not shown) for later usage.

Referring again to FIG. 1, the video data 12 is a temporal sequence of pictures, each referred to as the frame (or field) 22. Each picture is organized as a matrix of the macroblocks 24. Each macroblock 24 can have a size of 16×6 pixels and the macroblocks 24 are stored from left to right and from top to bottom and consecutive macroblocks 24 are combined in a slice 80 (see FIG. 3). Generally, a slice 33 contains the macroblocks 24 and one macroblock 24 consists of sub-blocks 25. Each macroblock 24 is composed of three images; one red (R), one green (G), and one blue (B). However, for compatibility with non-coloured media, the RGB model is represented as an equivalent YCbCr model, where Y is a luminance (luma) component, and Cb and Cr are chrominance (chroma) components, such that typically Y=0.299R+0.587G+0.114B, Cb=B−Y, and Cr=R−Y. Therefore, each frame 22 of the video data 12 is generically referred to as containing one luma image, one Cb chroma image, and one Cr chroma image. Standard formats have 8 bits per pixel to digitally represent each of the three components, where Cb and Cr images are typically down-sampled by 2 in each dimension due to the sensitivity of human vision. Generally, each block 25 consists of four pixels for the luma components and one pixel for each chroma component of the 4:2:0 color data. The blocks 25 are processed and compressed for transmission as the bit stream 15 over the network 14 or stored for later decompression or transmission.

Figure 2:
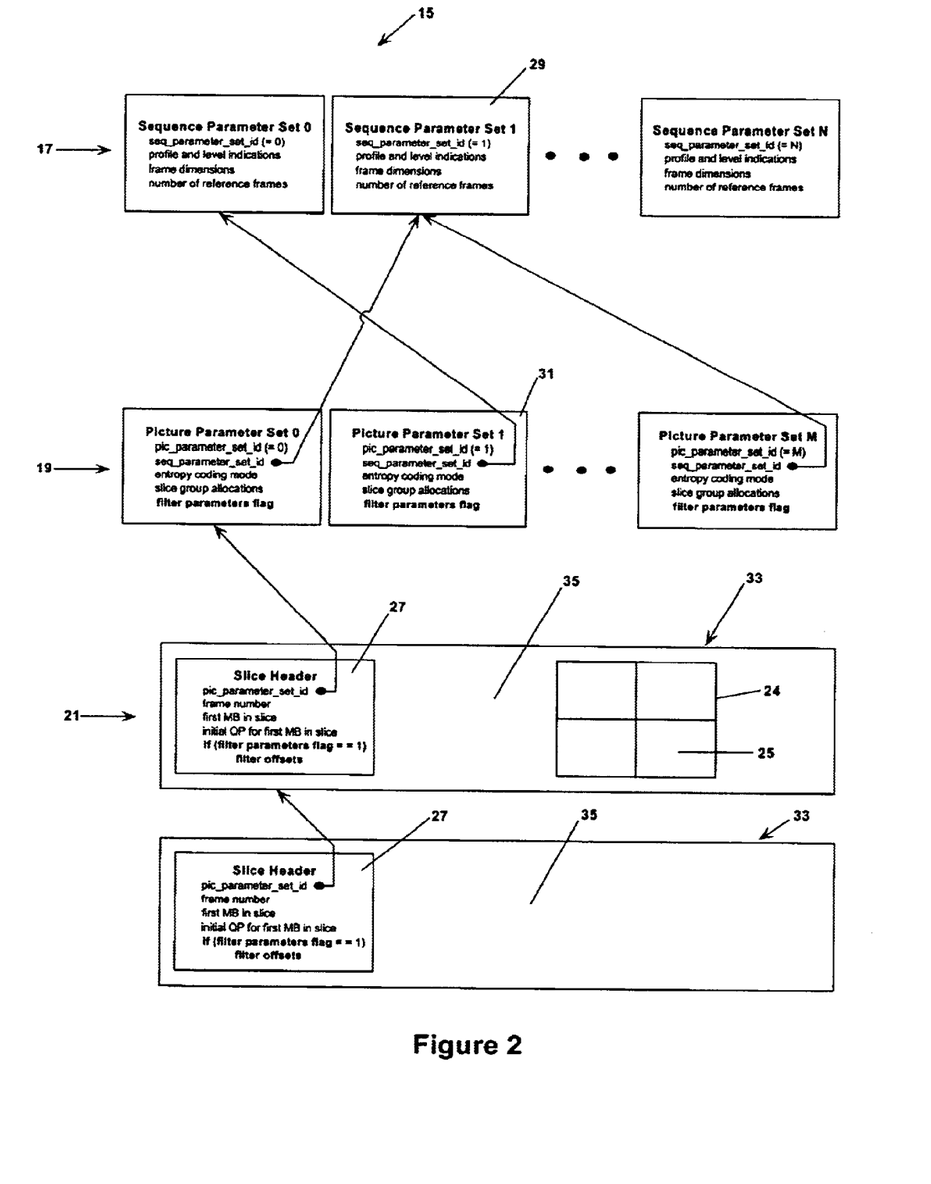
FIG. 2 is a bit stream of the system of FIG. 1.

Generally, one of three fundamental coding modes can be selected for each macroblock 24, with the choice of coding mode determining how the prediction of the macroblock 24 is formed. Intra-coded (I) macroblocks 24 make use of intra-prediction, in which the prediction is formed using only the current picture 22. In predictive (P), or inter-coded, macroblocks 24 the prediction of each sample is formed by referring to one block in the set of previously decoded and stored reference pictures 22. In bi-predictive (B) macroblocks 24, predictions can be formed in this way, but can also be formed by computing a weighted average prediction can be formed in this way, but can also be formed by computing a weghted average of two different blocks in the set of previously decoded reference picture 22. Note that some of the previously decoded pictures 22 are typically temporally subsequent to the current picture 22 in terms of their intended display order when bi-predictive coding is used. Referring to FIG. 2, depending on the mode of each slice 33, which is indicated in a slice header 27, P- and B-macroblocks 24 may not be permitted within certain slices 33.

Referring again to FIG. 2, the bitstream 15 is organizing into a hierarchy of syntax levels, with the 3 main levels being a sequence level 17, a picture (or frame) level 19, and slice level 21. A concept know as "parameter sets" allows efficient transmission of infrequently changing data at the sequence 17 and picture level 19 in the H.264 standard. A sequence parameter set 29 in the first level 17 includes values of parameters that will remain unchanged for an entire video sequence, or from one instantaneous decoder refresh (IDR) picture to the next. (IDR pictures are used to provide points of random access into the bitstream 15). Examples of parameters in a sequence parameter set 29 include frame dimensions and the maximum number of reference frames. A unique ID number "N" identifies each sequence parameter set 29.

A picture parameter set 31 in the second level 21 includes values of parameters that will remain unchanged within a coded representation of a picture (frame or field) 22. Examples of parameters in the picture parameter set 31 include the entropy coding mode and a flag that specifies whether deblocking filter parameters will be transmitted in the slice headers 27 of the picture 22 (see FIG. 1). Each picture parameter set 31, labeled as "M" refers to the unique ID of a valid sequence parameter set 29, which selects the active sequence parameters that are used picture 22 (see FIG. 1). Each picture parameter set 31, labeled as "M", refers to the unique ID of a valid sequence parameter set 29, which selects the active sequence parameters that are used when decoding coded pictures 22 that use the particular picture parameter set 3 1. The unique ID number "M" identifies each picture parameter set 31.

The slice 33 in the bit stream 15 contains a picture data 35 representing a sub-set of the macroblocks 24 of the complete picture 22. The macroblocks 24 in a slice 33 are ordered in raster scan order. The coded slice 33 includes the slice header 27 and the slice data 35 (coded macroblocks 24). The slice header 27 contains a coded representation of data elements 35 that pertain to the decoding of the slice data that follow the slice header 27. One of these data elements contains a reference to a valid picture parameter set 31, which specifies the picture parameter values (and indirectly the sequence parameter values) to be used when decoding the elements contains a reference to a valid picture parameter set 31, which specifies the picture parameter set 31. Other data elements in the slice header 27 include the initial quantization parameter for the first macroblock 24 in the slice 33. The macroblocks 24 can each consist of a grouping of pixels, such as a 16×16 luma block 25 with the two associated 8×8 chroma blocks 25. However, it is recognized that other sizes of blocks 24 could be used to represent the frames 22, if desired. The data corresponding to a coded macroblock 24 consists of: a skip count indicating the number of skipped macroblocks before the current macroblock, the MB_mode indicating Intracoded, Intercoded, or Bipredictive-Intercoded, the prediction_ mode (Intra-prediction modes for Intracoded macroblocks, motion vectors for Intercoded and Bipredictive-Intercoded macroblocks), the Coded Block Pattern indicating which sub-partitions have nonzero coefficients, the Delta Quantization Parameter indicating the current macroblock's QP, and the residual pixel data as coded by the CAVLC process.

Referring again to FIG. 2, each slice 33 of the frame 22 is encoded by the encoder 18 (see FIG. 1), independently from the other slices 33 in the frame 22. Each of the slices 33 has the slice header 27 that provides information, such as but not limited to the position of the respective slice 33 in the frame 22 as well as the initial quantization parameter; and the slice data which provides information for reconstructing the macroblocks of a slice, such as but not limited to the prediction modes and quantised coefficients for each of the respective macroblocks 24. Further, each picture parameter set 31contains parameter values that pertain to the decoding of the pictures 22 for which the particular parameter set 31 is active (i.e. selected in the slice headers 27 of the picture 22). The parameter sets 31 also contain a reference to the sequence parameter sets 29, which are active for decoding of the pictures 22. The choice of sequence parameter sets 29 and picture parameter sets 31 can be chosen by the encoder 18 (see FIG. 1), or set at the time of system 10 setup for sequential operation of the encoder 18, decoder 20 pair.

Figure 4:
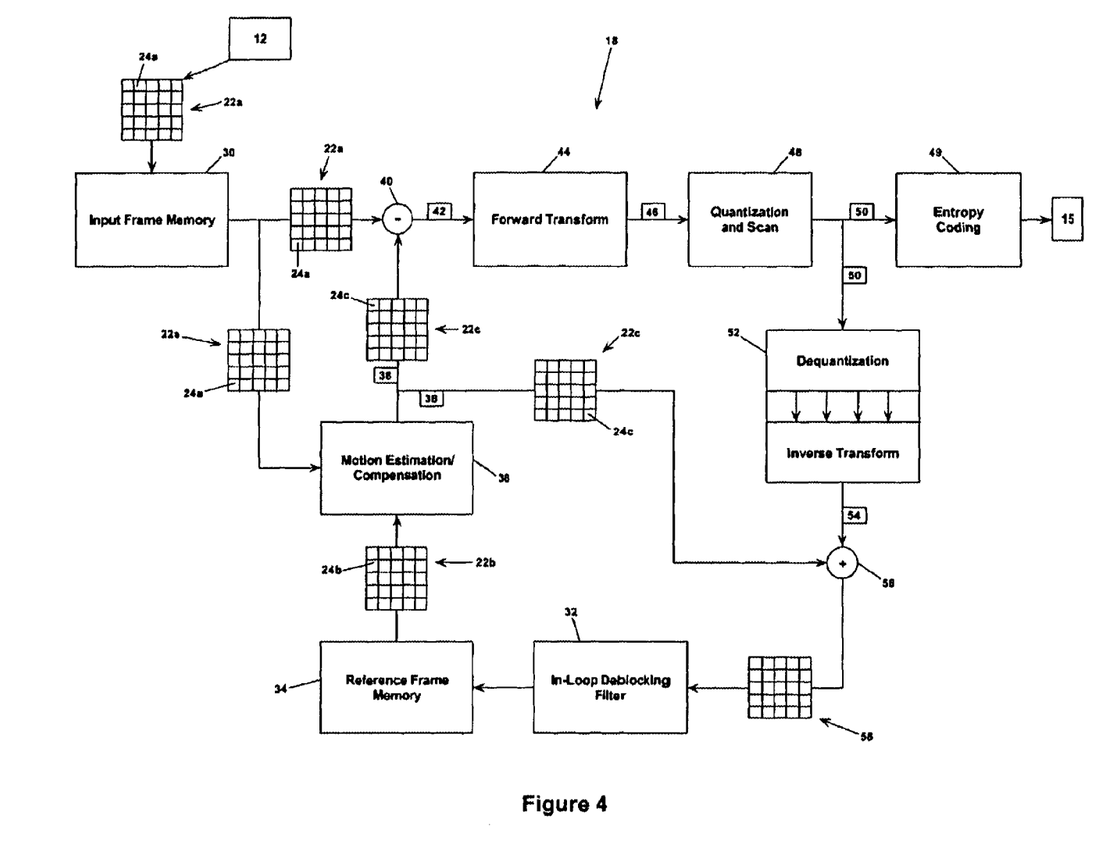
FIG. 4 is shows further details of an encoder from the system of FIG. 1.

Referring to FIG. 4, the encoder 18 of the system 10 has an input frame memory 30, for receiving an Nth or source frame 22a (a sequence of source blocks 24a) in the video data 12 from the participants A,B (see FIG. 1). A reference frame memory 34 stores an (N−1)th or reference frame 22b, typically as a sequence of blocks 24b. Each block 22a of the source frame 22a is first input into a motion estimation/compensation section 36, which produces predicted blocks 24c of a predicted frame 22c. The source frame 22a and the reference frame 22b are used 22a is first input into a motion estimation/compensation section 36, which produces predicted 22c, a best matching block taken from the blocks 24b in the reference frame 22b, such that temporal redundancies in the video data 12 are exploited for compression purposes. The matching block can be defined as the reference block 24b that minimises a prediction error 42 within a search area of the reference frame 22b. This matching process is done by the motion section 36 by determining movement of the object 26 (and of the background 28 if present, see FIG. 1) for a selected prediction block 24c, with respect to each reference block 24b from the frame 22b, by means of a block matching method as is known in the art. The predicted frame 22c is assembled by the motion section 36 as block 24c by block 24c to consist of matched blocks taken from the reference frame 22b, which correspond to the blocks 24a obtained from the source blocks 24a.

The motion section 36 also computes a displacement/motion vector 38 for representing temporal differences corresponding to each block 24c. A subtractor 40 computes the prediction error 42 between the source blocks 24a and the predicted blocks 24c, and passes the prediction error 42 to a transform section 44 for applying a forward transform. It is noted for intracoded blocks 22a that; the predicted frame 22c would be the reference frame 22b, no displacement/motion vectors 38 would be produced by the motion section 36, and therefore the error 42 would physically represent the difference between each block 22a, 22b pair.

The transform section 44 applies a frequency domain transform to the error 42 to produce a set of transform coefficients 46 representing the error 42. A quantization section 48 quantizes the set of transform coefficients 46 to produce a set of quantized coefficients 50, which helps to eliminate any video information that would be least detected by the human eye. Furthermore, the quantized coefficients 50 are reordered in zigzag fashion from low frequency to high frequency, which allows for more efficient coding of the quantized coefficients by an entropy coding section 49 as more zero values (typically high frequency coefficients) will be packed together (further described below). It is recognised that the motion section 36, the subtractor 40, and the transform section 44 could be collectively referred to as the processing packed together (further described below). It is recognised that the motion section 36, the subtractor 40, and the transform section 44 could be collectively referred to as the processing section for producing the transform coefficients 46 representing the source frame 22a.

The entropy coding section 49 combines the quantised coefficients with the motion vectors 38 and other encoder information to produce the compressed or encoded bit stream 15. In particular, the coefficients 50 usually are coded by the section 49 using Run_before and Coefficient_level symbols, instead of coding each coefficient 50 individually to increase compression efficiency. In such a scheme, zero coefficients 50 are not coded explicitly but are coded implicitly with non-zero coefficients. Each non-zero coefficient 50 is coded by; a Run_before symbol indicating the number of consecutive zero coefficients before the current coefficient 50, and a Coefficient_level symbol indicating the current non-zero coefficient 50 value. Further, the Coefficient_levels and Run_before are transmitted in two separate sequences which are entropy encoded.

For both interceded and intracoded blocks, the quantized coefficients 50 are sent to a dequantization-inverse transform section 52 of the encoder 18, to produce the reconstructed prediction error 54, based on the inverse quantization operation and an inverse transform operation which takes as input the transform coefficients produced by the inverse quantization block and produces a block or pixel luminance values based on the inverse transform operation. An adder 56 then adds the predicted frame 22c with the error 54 to produce a new Nth reference frame 58 to be stored in the memory 32 for subsequent encoding of the next (N+1)th source frame (not shown). The encoder 18 (see FIG. 1) emulates the behaviour of the decoder 20 for coded blocks 22 to make sure the encoder 18 of the transmitting participant A,B and the decoder 20 of the receiving participant A,B work from the same reference frames 22b. Further, a deblocking filter 32 may be applied on the reconstructed frame 58 block boundaries, which helps to reduce the visibility of coding artifacts that can be introduced at those boundaries.

The decoder 20 (see FIG. 3) of the receiving participant A,B processes the received bit stream 15 and then reconstructs the coded frame, using a stored copy of the reference frame 22b, the transmitted motion vectors 38, and the decompressed or reassembled prediction error 54 contained in the bit stream 15. It is recognised that the motion vectors 38 are not operated on by the transform 44 and quantization 48 sections, but are included by the coding section 49 with the quantized coefficients 50 to assemble the bit stream 15.

Figure 3:
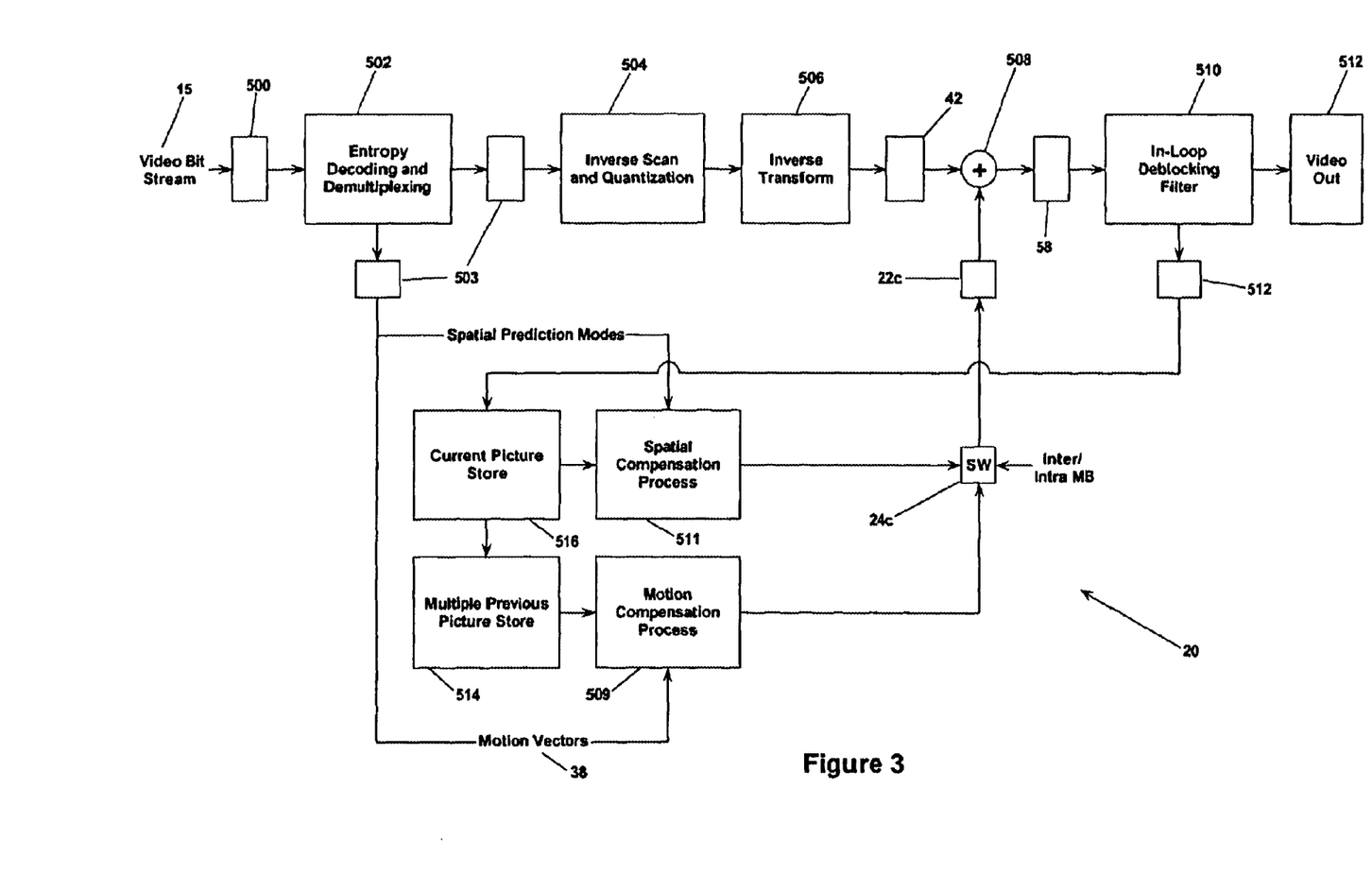
FIG. 3 shows further details of a decoder of the system of FIG. 1.

Referring to FIG. 3, the bit stream 15 is then processed by the decoder 20 to produce reconstructed video images 512, which correspond to the reconstructed frames 58 of the encoder 18. An example H.264 decoder 20 is fully specified in the H.264 standard. The decoder 20 is base on functional units or components. These functional units include a buffering unit 500 that receives the compressed bitstream 15, an entropy decoder 502 which decodes the received bit stream 15 to produce syntax elements 503 used in subsequent processing by the other decoder components, a motion compensated prediction unit 509 to produce the predicted frame 22c on a block 24c by block 24c basis (or a spatial compensation unit 511 in the case of intracoding), an inverse scanning and quantization unit 504, and a transform unit 506 to reproduce the prediction error 42, a reconstruction unit 508 that adds the prediction error 42 to the predicted frame 22c to produce the reconstructed frame 58, and a deblocking filter 510 that smoothes the edges of sub-blocks 25 (see FIG.

2) within the reconstructed frame 58 to produce the filtered reconstructed frame 512. The filtered frame 512 is stored in a current picture store 516. Each of the above mentioned components is discussed in more detail in the following.

The incoming video bitstream 15 is stored in the buffer 500 at the input to the decoder 20. The first stage in the decoding process includes the parsing and decoding of the entropy coded bitstream 15 symbols that are stored in the buffer 500 to produce the syntax elements 503 used by the other decoder components. For example, in the H.264 standard, two different entropy-coding modes are supported. The first method is based on using a context adaptive variable length coding (CAVLC) method to entropy decode the transform coefficients and a universal variable length coding (UVLC) which makes use of a single code-table for all syntax elements to entropy decode the rest of the information from the encoder 18. The second method is based on context-adaptive binary arithmetic coding (CABAC), is more complex and compression efficient. The complexity of the CABAC method derives from the need to continually update a large set of context models throughout the decoding process, and the arithmetic decoding of symbols. The CAVLC/UVLC method can be implemented with a relatively small number of operations, requiring the parsing of each symbol and table lookups.

The various syntax elements in the bitstream 15 are de-multiplexed for use in different processes within the decoder 20. High-level syntax elements 503 include temporal information for each frame 22, and frame coding types and frame dimensions. H.264 coding, as with earlier standards, is based primarily on macroblocks 24 (see FIG. 1) consisting of 16×16 luminance-pixel blocks 25 and 2 8×8 chrominance pixel blocks 25. On the macroblock 24 level, syntax elements 503 include the coding mode of the macroblock 24, information required for forming the prediction, such as motion vectors 38 and spatial prediction modes, and the coded information of the residual (difference) blocks 42, such as the coded block pattern (CBP) for each macroblock 24 and quantized transform coefficients for each of the underlying blocks 25.

Depending on the coding mode of each macroblock 24, the predicted macroblock 24c can be generated either temporally (inter coding) or spatially (intra coding). The prediction for an inter coded macroblock 24c is determined by the motion vectors 38 that are associated with that macroblock 24c. The motion vectors 38 indicate the position within the set of previously decoded frames 22 from which each block of pixels will be predicted. Each inter coded macroblock 24c can be partitioned in one of seven ways, with luminance block sizes ranging from 16×16 pixels to 4×4 pixels. Also, a special SKIP mode exists in which no motion vectors 38 (or coded residual blocks) are transmitted and the prediction is based on the motion vector derived from neighbouring macroblocks' motion vectors. Thus, 0 to 16 motion vectors can be transmitted for each inter coded macroblock 24c. Additional predictive modes are supported when B-pictures are employed.

Motion vectors 38 are coded using either median or directional prediction, depending on the partition that is used for the luminance component of the macroblock 24c. For each motion vector 38, the predicted block 25 must be computed by the decoder 20 and then arranged with other blocks 25 to form the predicted macroblock 24c. Motion vectors 38 in H.264 are specified generally with quarter-pixel accuracy. Interpolation of the reference video frames 22b is necessary to determine the predicted macroblock 24c using sub-pixel accurate motion vectors 38. The complexity of the required interpolation filter varies as follows. To generate the predicted macroblock 24c using half-pixel accurate motion vectors 38, an interpolation filter can be employed that is based on a 6-tap windowed sinc function. In the case of prediction using quarter-pixel accurate motion vector 38, filtering can consist simply of averaging two integer- or half-pixel values (i.e., two pixels from the interpolated reference frame 22b that is used to generate the half-pixel accurate motion vector 38), although one of every 12 quarter-pixel values (a.k.a. the "funny position") is replaced by the average the four surrounding integer-pixel values, providing more low-pass filtering than the remaining positions. A bilinear filter is used to interpolate the chrominance frames when sub-pixel motion vectors 38 are used to predict the underlying chrominance blocks 25.

The H.264 standard also supports the use of multiple (previous for P-pictures) reference frames 22b for prediction. Selection of the particular reference frame 22b is made on a macroblock 24 basis. This feature can improve both coding efficiency and error resilience. However, this feature also requires that the decoder buffer 500 store several previously decoded and reconstructed frames 58, rather than just the most recent reconstructed frame 58, increasing substantially the decoder's 20 memory requirements.

Two different modes are supported in intra coding of macroblocks 24. In the 4×4 Intra mode, each 4×4 block 25 within the macroblock 24 can use a different prediction mode. There are 9 possible modes one DC and 8 directional prediction modes. The complexity of the prediction mode varies, with the DC, vertical and horizontal modes being the least complex, and the diagonal modes being the most complex. In the 16×16 Intra mode, which is generally used in smooth areas, there are 4 modes available: DC, vertical, horizontal and planar, with the latter being the most complex. The prediction of intra-coded blocks 24, 25 is always based on neighboring pixel values that have already been decoded and reconstructed.

The decoding of the residual (difference) macroblock requires that a number of inverse transforms be performed, along with associated inverse scanning and quantization operations. The decoding of the difference macroblock is based primarily on the transformation of 4×4 blocks 25 of both the luminance and chrominance pixels, although in some circumstances, a second-level transform must be performed on the DC coefficients of a group of 4×4 blocks 25. More specifically, a special 2×2 transform is applied to the 4 DC coefficients of the blocks 25 of the chrominance pixels. For macroblocks 24 that are being coded in the 16×16 Intra mode, an additional scan and transform are applied to the DC values of each of the 16 4×4 luminance blocks of the macroblock 24.

The inverse transforms that are required for each macroblock 24 are determined based on the coding mode and the coded block pattern (CBP) of the macroblock 24. The input data are the Run_before-Coefficient_level codes that are parsed by the entropy decoder 502. These are put into their correct order based on the Run_before values through the inverse scanning 504 process and then the Coefficient_ levels, which represent quantized transform coefficients, are inverse quantized via multiplication by a scaling factor. Finally, the necessary integer-specified inverse transform 506 is performed on the inverse quantized coefficients. The inverse transformed result for each macroblock 24 is added to the predicted macroblock 24c and stored in the reconstructed frame buffer 514.

In the final stage of the decoding process, the decoder 20 applies the normative de-blocking filtering process 510, which reduces blocking artifacts that can be introduced by the coding process. The filter 510 is applied within the motion compensation loop.

The entropy decoding of quantized transform coefficients is currently done in the context of an H.264 standard, where entropy encoding/decoding of coefficients is performed on a 4×4 block basis, and involves two major steps. The Run_before and Coefficient_level are first entropy decoded from the bitstream, then the coefficients are reconstructed using the Run_before and Coefficient_level information in an zig-zag scan. Run_before is the number of consecutive zero coefficients preceding a non-zero coefficients in zigzag order from low frequency coefficients to high frequency coefficients, and Coefficient_level is the value of the non-zero coefficients. The following example is used to illustrate the major two steps used in the entropy encoding/decoding process.

As an example, consider the following 4×4 block of quantized transform coefficients at the encoder

| 6 | 0 | 0 | 0 |
| 5 | −4 | 0 | 0 |
| 0 | 3 | 0 | 0 |
| 0 | −1 | 1 | 0 |

The first step in the encoding process for the above 4×4 quantized transform coefficients is to apply a zigzag scan to the above quantized transform coefficient block to produce a series of coefficients. The zigzag scan is performed according to the following diagram:

The resulting series of coefficients is then 6, 0, 5, 0, −4, 0, 0, 0, 3, 0, −1, 0, 0, 0, 1, 0. The coefficients are typically grouped into (Run_before, Coefficient_level) pairs where Run_before is the number of consecutive zero coefficients preceding a non-zero coefficients in the resulting zigzag order from low frequency coefficients to high frequency coefficients, and coefficient_level is the value of the non-zero coefficients. The resulting (Run_before, Coefficient_level) pairs are then (0,6) (1,5), (1,−4), (3,3), (1,−1) and (3,1). The Run_before information is then separated from the Coefficient_level information and each is placed in a separate sequence. The resulting Run_before and Coefficient_level sequences are then:

Run_before: 6, 5, −4, 3, −1, 1

Coefficient_level: 0, 1, 1, 3, 1, 3

The second step in the coding process is to encode the Run_before information and the Coefficient_level information to produce the bit stream corresponding to the original quantized 4×4 transform coefficient data.

At the decoder side, the first step in the entropy decoding process for the coded quantized transform coefficient data is to decode the bitstream generated by the encoder to produce the Run_before information and the Coefficient_level information. For the example discussed above, this first step in the decoding process results in the following two sequences:

Run_before: 6, 5, −4, 3, −1, 1

Coefficient_level: 0, 1, 1, 3, 1, 3

The second step in the decoding process is to use the zigzag scan order described above to recover the 4×4 block of quantized transform coefficients based on the above two sequences.

Figure 5:
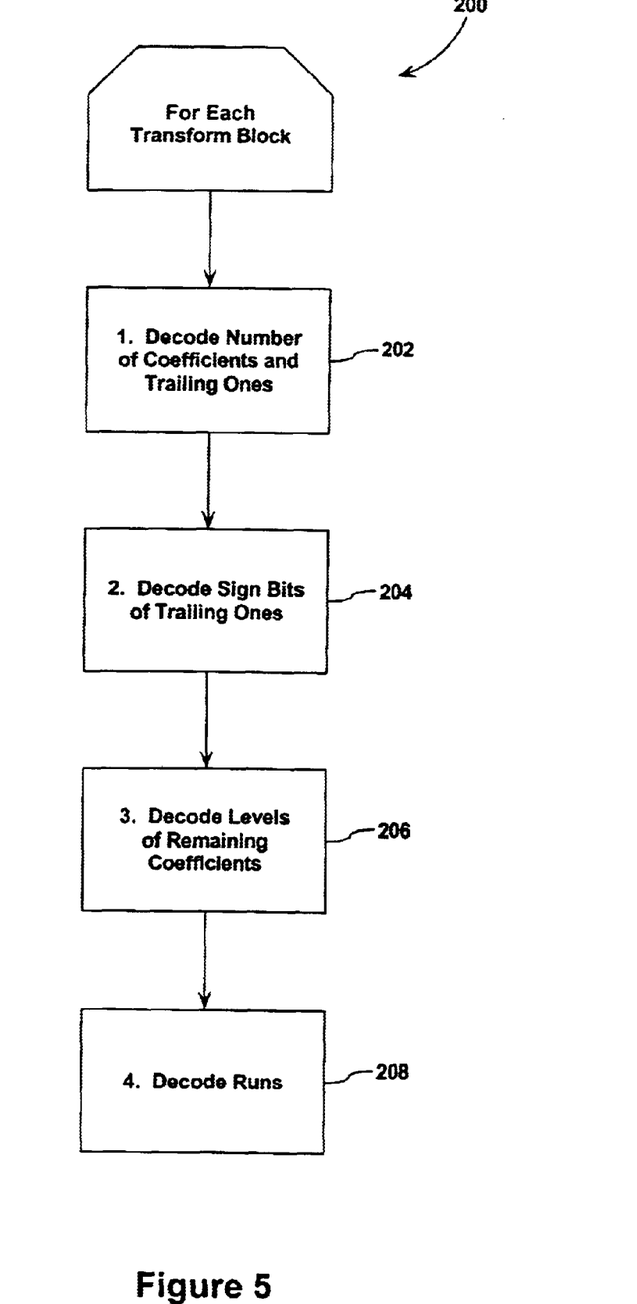
FIG. 5 shows a coding process for the decoder of FIG. 3.
Figure 6:
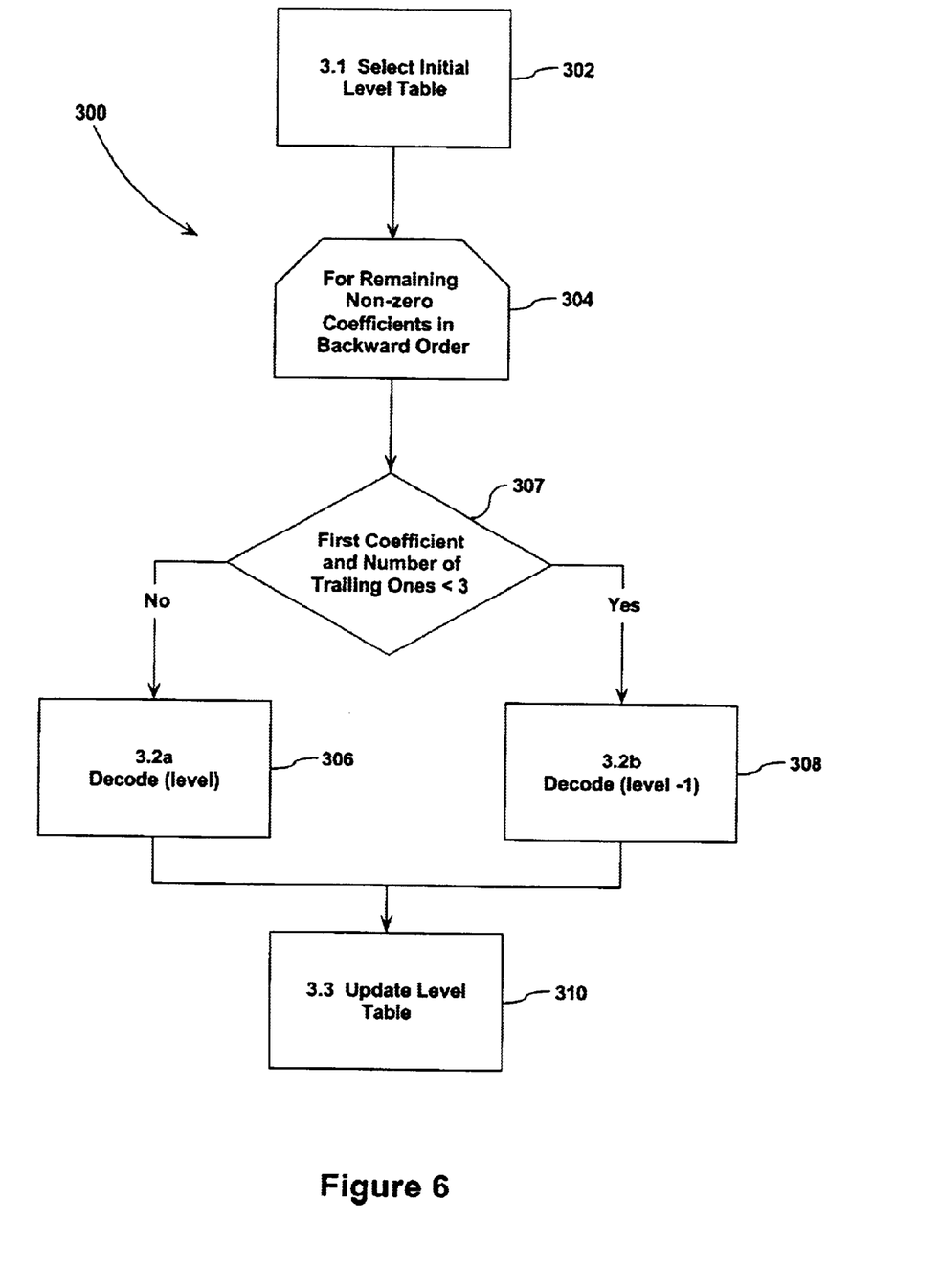
FIG. 6 shows a flowchart for the decoding scheme for the decoder of FIG. 3.

As described above, the decoding process starts by entropy decoding the information provided by the encoder 18. Entropy decoding represents a significant component of the decoding process, especially when a significant number of transform coefficients are to be decoded. FIG. 5 and FIG. 6 illustrate the steps involved in the decoding process 200 of the CAVLC coded transform coefficients. The process 200 takes as input a context-adaptive variable-length-encoded bitstream and outputs a sequence of Run_before and Coefficient_levels of a single transform block. The Run_before and Coefficient_level sequences are decoded in the backward zigzag order, from coefficients 50 corresponding to high frequency to coefficients 50 corresponding to low frequency.

In the first step 202, the total number of non-zero coefficients and the number of trailing ones are decoded using 2-dimensional VLC tables. It is noted that the number of trailing ones (T1s) is always less than or equal to three. The rest of the coeficients, regardless of whether their absolute value is one or not, are decoded in step 206. Limiting of the number of trailing ones (T1s) to three is given by example only. In step 204, the sign bits of the trailing ones are decoded using 1 bit each, where the value "0" is given for positive and the value "1" is given for negative signs. In step 206, the rest of the coefficient_levels are decoded using different tables Lev-VLCN (further defined below) and an adaptive table selection scheme 300 shown in FIG. 6. In step 208, the total sum of Run_before and all the Run_before are decoded. In particular in step 206, the 7 VLC tables are named Lev-VLC0, Lev-VLC1, Lev-VLC2, Lev-VLC3, Lev-VL4, Lev-VL5, and Lev-VL6, referred to collectively as Lev-VLCN. It should be noted that Lev-VLC0 has its own structure, while the other tables Lev-VLC1, Lev-VLC2, Lev-VLC3, Lev-VL4, Lev-VL5, and Lev-VL6 share a common structure defined as follows:

```
Let "level_code" be the level information to be decoded from the
tables Lev-VLCN,
If(|level_code|−1)<(15<<(N−1)),
Code 0 . . . 01x . . . xs,
    where   number of 0's =  (|level_code|−1) >> (N−1),
            number of x's =  N−1,
            value of x's =   (|level_code|−1) % 2^(N−1),
            s =              sign bit(0-positive, 1-negative)
elseif(|level_code|−1 >= 15<<(N−1)),
28-bit escape code:     0000 0000 0000 0001 xxxx xxxx xxxs,
    where   value of x's =   (|level_code|−1) − (15>>(N−1)),
            s =              sign bit(0-positive, 1-negative).
```

In the above, N is a value used for table Lev-VLCN selection (i.e. N=1 specifies table Lev-VLC1). Since the structure of the tables is well defined by N, it is recognised that new tables Lev-VLCN can easily be created above Lev-VLC6, if desired. The tables Lev-VLCN for N=0 to 6 are as follows:

| Code no | Code (bitstream bits) | Coefficient Level (LevelCode) |
|---|---|---|
| Lev-VLC0 | | |
| 0 | 1 | 1 |
| 1 | 01 | −1 |
| ... | ... | ... |
| 13 | 00000000000001 | −7 |
| 14–29 | 000000000000001xxxs | ±8 to ±15 |
| 30 −> | 0000000000000001xxxxxxxxxxxs | ±16 −> |
| Lev-VLC1 | | |
| 0–1 | 1s | ±1 |
| 2–3 | 01s | ±2 |
| ... | ... | ... |
| 28–29 | 000000000000001s | ±15 |
| 30 −> | 0000000000000001xxxxxxxxxxxs | ±16 −> |
| Lev-VLC2 | | |
| 0–3 | 1xs | ±1 to ±2 |
| 4–7 | 01sx | ±3 to ±4 |
| ... | ... | ... |
| 56–59 | 000000000000001xs | ±29 to ±30 |
| 60 −> | 0000000000000001xxxxxxxxxxxs | ±30 −> |
| Lev-VLC3 | | |
| 0–7 | 1xxs | ±1 to ±4 |
| 8–16 | 01xxs | ±5 to ±8 |
| ... | ... | ... |
| 112–119 | 000000000000001xxs | ±57 to ±60 |
| 120 −> | 0000000000000001xxxxxxxxxxxs | ±61 −> |
| Lev-VLC4 | | |
| 0–15 | 1xxxs | ±1 to ±8 |
| 16–31 | 01xxxs | ±9 to ±16 |
| ... | ... | ... |
| 224–239 | 000000000000001xxxs | ±113 to ±120 |
| 240 −> | 0000000000000001xxxxxxxxxxxs | ±121 −> |
| Lev-VLC5 | | |
| 0–31 | 1xxxxs | ±1 to ±16 |
| 32–63 | 01xxxxs | ±17 to ±32 |
| ... | ... | ... |
| 448–479 | 000000000000001xxxxs | ±225 to ±240 |
| 480 −> | 0000000000000001xxxxxxxxxxxs | ±241 −> |
| Lev-VLC6 | | |
| 0–63 | 1xxxxxs | ±1 to ±32 |
| 64–127 | 01xxxxxs | ±33 to ±64 |
| ... | ... | ... |
| 896–959 | 000000000000001xxxxxs | ±449 to ±480 |
| 960 −> | 0000000000000001xxxxxxxxxxxs | ±481 −> |

Regarding the above tables Lev-VLCN, all coefficient 50 levels "Coefficient_level" are equal to the decoded LevelCode value given in tables Lev-VLCN. In other words, the data elements of the coefficient 50 matrix are represented by the LevelCode column of the tables Lev-VLCN. Further, when the number of trailing ones is less than three, the level of the first coefficient (after the T1s) is equal to the decoded LevelCode plus 1, such that If this is the first coefficient after trailing ones and number of trailing ones is <3
   coefficient_level=(|LevelCode|+1)*sign(LevelCode)
else
   Coefficient_level=LevelCode.

Further, it is noted that the last two entries in table Lev-VLC0 are escape codes. The first escape code with 19 bits, three "x" s and a "s" (level code and sign bit), is used to decode the 8 levels above the last regularly coded level. The next escape code with 28 bits, 11 "x" s and a "s" (level code and sign bit), is used to decode all remaining higher levels. It should be noted that for Lev-VLC1, Lev-VLC2, Lev-VLC3, Lev-VLC4, Lev-VLC5, and Lev-VLC6, only the 28 bit escape code is used.

Figure 7:
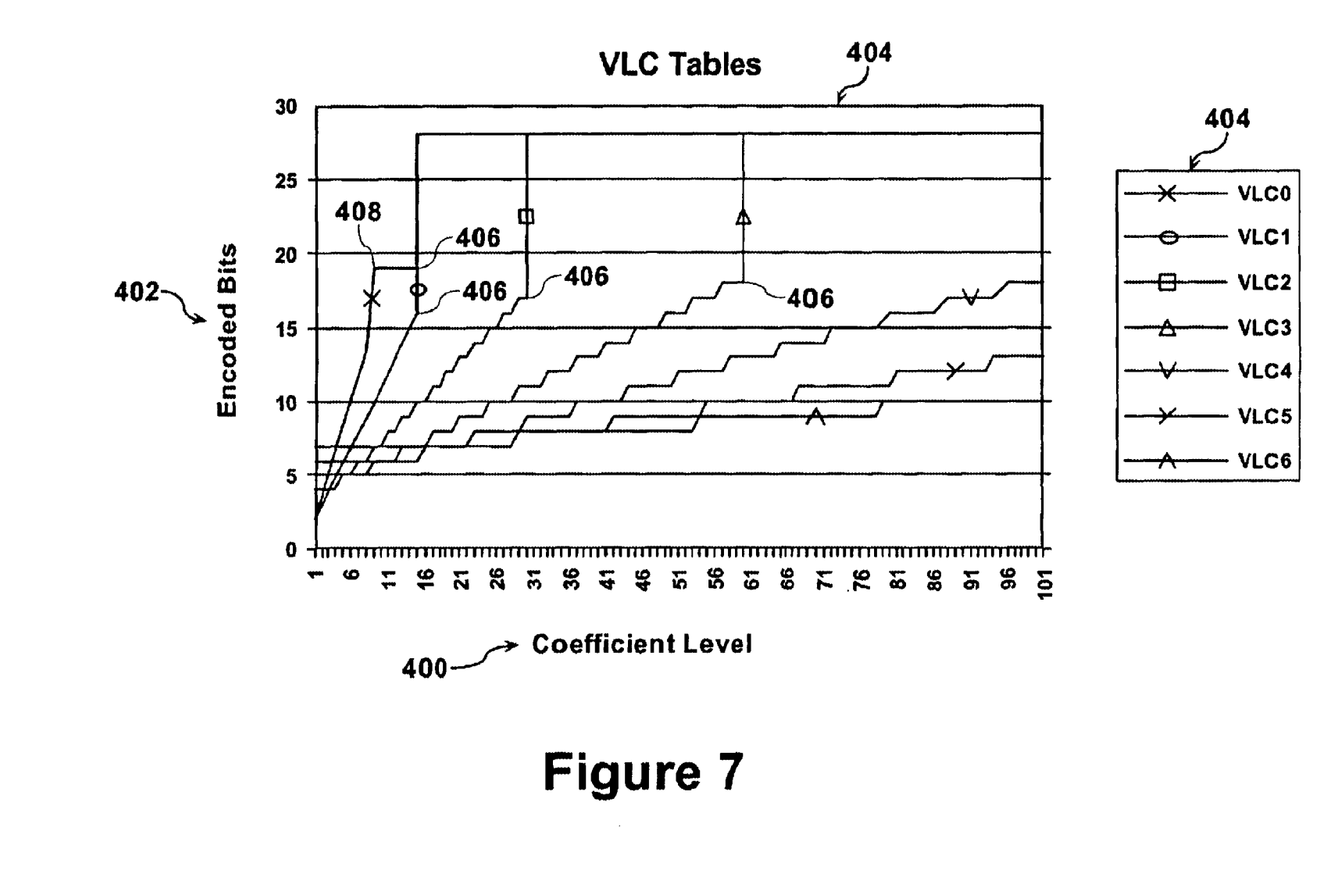
FIG. 7 shows a graphical representation of tables used by the decoder of FIG. 3.

Referring to FIG. 7, the Coefficient_levels 400 are decoded from the encoded bits 402 through the use of the tables, represented graphically by the lines 404. The 28 bit escape codes represent the discontinuities 406, while the 19 bit escape codes represent the discontinuity 408. It is further recognized that Lev-VLC0 is only used in first coefficient. Thus, a decoder module may process the subsequent coefficients in a loop that involves only 28-bit escape code.

Referring to FIG. 6, the scheme 300 (details of step 206 of FIG. 5) decodes the sequence of Coefficient_levels from the input bitstream. First, in step 302, the initial Lev-VLCN table is selected based on the number of non-zero coefficients of the current block 24 and the number of T1s, as:

if (total number of coefficients>10 and number of trailing ones is <3) then
    N=1//Use Lev-VLC1 for the first coefficient after trailing ones
  else
    N=0 //Use Lev-VLC0 for the first coefficient after trailing ones For the remaining 304 non-zero coefficients, the table Lev-VLC1 or Lev-VLC0 selected is then used to decode 306 or 308 the first coefficient level corresponding to the selected table. A decision 307 is performed to toggle between the two initial table selections Lev-VLC1 or Lev-VLC0.

After decoding the initial coefficient level of the sequence of Coefficient_levels, a table selection update step 310 is performed to select an appropriate table Lev-VLCN for decoding the next Coefficient_level in the sequence. The most recently decoded level and current Lev-VLCN table is used to select the next table Lev-VLCN to be used. The update step 310 is as follows.

Let "N" denote current table number N in Lev-VLCN, and |level| denote the absolute value of most recently decoded Coefficient_level.

1. Lookup vlc_inc from VLC_INC Table using N

| VLC_INC Table | |
|---|---|
| N | vlc_inc |
| 0 | 0 |
| 1 | 3 |
| 2 | 6 |
| 3 | 12 |
| 4 | 24 |
| 5 | 48 |
| 6 | Infinite |

(or vlc_inc table[N] = {0, 3, 6, 12, 24, 48, infinite})

2. if (|level|>vlc_inc[N])
   N=N+1
  else
   N=N 3. if (this is first coefficient after trailing ones and |level|>3)
   N=2

In other words, the current Lev-VLCN table is used for decoding the next coefficient 50 except when the absolute value of the most recent decoded level (|level|) is greater than a threshold based on vlc_inc table, and in such cases the next bigger Lev-VLCN+1 table is selected for decoding the next coefficient 50. An exception applies when the most recent decoded coefficient 50 is the first coefficient 50 after trailing ones. In such cases, when |level| is greater than three, Lev-VLC2 is used for next coefficient level. Accordingly, the process 300 for decoding the Coefficient_levels and then updating Lev-VLCN tables repeats for each non-zero Coefficient_level of the sequence of Coefficient_levels for the current block 24 until all non-zero Coefficient_levels are decoded. It should be noted that the first coefficient 50 of the sequence of Coefficient_levels is decoded with table Lev-VLC1 or Lev-VLC0, while the rest of the coefficients 50 are decoded with Lev-VLC1 to Lev-VLC6.

It should be noted that in the known prior art coding schemes, every table has two escape codes (both 19-bit escape and 28-bit escape codes (similar to table Lev-VLC0 as given above)). This can lead to two discontinuities in every table, which can significantly decrease possible levels of parallel processing during the decoding process and can increase decoding process complexity. It has been experimentally determined that given the table selection scheme 300, removal of the 19-bit discontinuity in tables Lev-VLC1 to Lev-VLC4 did not lead to any significant reduction in compression efficiency, and significantly decreased complexity as compared to the known tables.

Further, in the known coding schemes as described above, Lev-VLC1 is used only when the block is intra-coded with low quantization parameter (high bit rate) i.e. QP<21. It has also been experimentally determined for the new scheme 300 that using table Lev-VLC1 for the first coefficient can be also beneficial for some inter-coded blocks that have many coefficients. In fact, the number of coefficients and number of trailing ones was experimentally determined to predict VLC statistics better than the intra/inter-coding mode and QP. Furthermore, removing the coding mode and QP as input parameters for the scheme 300 can help reduce data structure loads. This modification can help to improve both compression efficiency and reduce the complexity of the implementation of the CAVLC decoding method.

Further, in the known prior art as described above, VLC table selections were updated differently for intra blocks with QP<21 and other block types. It has been experimentally determined that one method can be designed to provide good compression for all block types and QP by employing the following rules which are used by the scheme 300:

1. Increase Lev-VLCN only when Coefficient_level exceeds the optimal compression range of current table: (upper_optimal_limit(Lev-VLCN))=$3 \times 2^{N-1}$, and
2. Extend the number of tables to seven (Lev-VLC5, Lev-VLC6) using the same structure as the Lev-VLC1 to Lev-VLC4 tables to adjust to large coefficient levels without increasing complexity These rules lead to the design of the new table selection update threshold while helping to reduce complexity (reduced number of logic paths) and enhancing compression efficiency and robustness.

In summary, the range of Lev-VLC tables of the scheme is extended according to one general formula, as described above. Further, only 1 escape code (28-bit escape code) is used for tables Lev-VLC1 to Lev-VLC6. The table Lev-VLCN selection initialization step of the scheme 300 depends only on the total number of non-zero coefficients and the number of trailing ones, which are local variables in the transform coefficient entropy decoding module. The table selection update step 310 uses one table of thresholds to select the Lev-VLCN table for the next coefficient, regardless of the particular block modes and quantization parameters under consideration.

The following are Table Initialization examples using the scheme 300. Table initialization process 302 is used to select appropriate VLC table for coding the first coefficient 50 in the sequence of Coefficient_levels. It is noted that both the # of coefficients (number of coefficients) and the # of trailing ones (number of trailing ones) are locally available parameters of the scheme (note bolded levels are coded already from steps selected from steps 26 306, 307, and 202, 204 ).

```
InitialTable = Initiatization(# of coefficients (local), # of trailing
               ones (local))
               if(#coeff >10 and #trailing ones < 3)
                  use VLC1
               else
                  use VLC0
```

Example 1:                   trailing ones already decoded in step 202

Coeficient levels in bitstream: 1, 3, 3, 4, 6, 8, 8, 10, 11, 15
    level to be decoded now: 3
# of coefficients = 11
# of trailing ones = 1
Initial Table = VLC1
Note: Lev-VLC1 is used to decode 3 which is more efficient than Lev-VLC0

Example 2:                   trailing ones already decoded in step 202

Coefficient levels in bitstream: 1, 1, 1, 1, 2
level to be decoded now: 1
# of coefficients = 5
# of trailing ones = 3        (only up to 3 T1's are decoded in step 202)
Initial Table = VLC0
Note: Lev-VLC0 is well suited for small levels such as a value of 1

The following are Table Update examples using the scheme 300. The step 310 is used to select tables for decoding subsequent coefficient levels.

```
NextTable = Update(VLC table (recursive), previous level)
            if (|previous level| > vlc_inc)
               next N = N + 1
            else
               next N = N
```
Example 1: (note bolded levels are decoded already from steps 306, 307, and 202, 204)
Coefficient level in bitstream: 1, 3, 4, 6, 8, 8, 10, 11, 15
    level to be decoded now: 4
Previous Level:    3
Previous Table:    VLC1
vlc_inc(VLC1):     3 (selected from N=1 in table)
Table =            VLC1
Since 3 is not greater than 3, we use VLC1 to decode level = 4
Example 2:
Coefficient level in bitstream: 1, 3, 4, 5, 5, 6, 8, 8, 10, 11, 15
    level to be decoded now: 5
Previous Level     4
Previous Table     VLC1
vlc_inc(VLC1):     3 (selected from N=1 in table)
Table =            VLC2
Since 4 is greater than 3, we use VLC2 to decode level = 5.

| VLC_INC Table | |
|---|---|
| N | vlc_inc |
| 0 | 0 |
| 1 | 3 |
| 2 | 6 |
| 3 | 12 |
| 4 | 24 |
| 5 | 48 |
| 6 | Infinite |

Although the invention has been described with reference to certain specific embodiments, various modifications thereof will be apparent to those skill in the art without departing from the spirit and scope of the invention as outlined in the claim appended hereto.

The embodiments of the invention in which an exclusive property on privilege is claimed are defined as follows:

1. A Context-Adaptive Variable Length Coding (CAVLC) system for decoding quantised transform coefficient levels, the system comprising:

a) an input for a bitstream including context-adaptive variable-length-encoded Run_before and Coefficient_level data corresponding to quantized transform coefficients;

b) an entropy decoding section for decoding the Run_before and Coefficient_level data; and c) a plurality of decoding tables used by the entropy coding section for decoding coefficient_levels, at least two of the decoding tables have a single escape sequence and are generated by a common function;

wherein selection from the plurality of decoding tables for the first Coefficient_level is determined solely by local variables representing a total number of non-zero coefficients and a number of trailing ones in the sequence of Coefficient_levels and selection from the plurality of decoding tables for subsequent Coefficient_levels is determined solely by a previous decoded coefficient_level and an experimentally pre-determined table.

2. The system according to claim 1, wherein the decoding process further comprises a first sub-process and a second sub-process for decoding the quantized transform coefficients.

3. The system according to claim 1, wherein the first sub-process performs an initial table selection from a primary table or a secondary table chosen from the plurality of tables.

4. The system according to claim 3, wherein the primary table is LEV-VLC0 and the secondary table is Lev-VLC1.

5. The system according to claim 4, wherein the first sub-process selects the table Lev-VLC0 if a number of non-zero coefficients of the quantized coefficients is greater than ten and a number of trailing coefficients with a level equal to one is less than three, otherwise the first sub-process selects the table Lev-VLC1.

6. The system according to claim 5, wherein the first sub-process is:

if (total_coeff(coeff_token)>10 && trailing ones(coeff_token) <3)
      N=1 //Use Lev-VLC1 for the first coefficient
   else
      N=0 //Use Lev-VLC0 for the first coefficient.

7. The system according to claim 1 further comprising selection from the plurality of decoding tables for the first Coefficient_level after trailing ones is determined solely by local variables representing a total number of non-zero coefficients and a number of trailing ones in the sequence of Coefficient_levels.

8. The system according to claim 7, wherein the selection criteria for the plurality of tables further comprises a local table listing and a previous decoded coefficient_level.

9. The system according to claim 8, wherein the local table listing is:

| VLC_INC Table | |
|---|---|
| N | vlc_inc |
| 0 | 0 |
| 1 | 3 |
| 2 | 6 |
| 3 | 12 |
| 4 | 24 |
| 5 | 48 |
| 6 | Infinite. |

10. The system according to claim 2, wherein the second sub-process selects a secondary table from the plurality of tables.

11. The system according to claim 10, wherein the second sub-process is:

1. Lookup vlc_inc from VLC_INC Table using Lev-VLCN from vlc_inc table[N] = {0, 3, 6, 12, 24, 48, Infinite};
2.    if(|level| > vlc_inc[N])
         N = N + 1
      else
         N = N;
3.    if(this is first coefficient and |level| > 3)
   N = 2.

12. The system according to claim 1 further comprising a single function for generating at least two of the plurality of tables.

13. The system according to claim 12, wherein the single function is:

if(|level_code|−1)<(15<<(N−1)),
  Code: 0 . . . 01x . . . xs,
    where   number of 0's =  (|level_code|−1) >> (N−1),
                 number of x's =  N−1,
                 value of x's =   (|level_code|−1) % $2^{(N-1)}$
                 s =              sign bit(0-positive, 1-negative)
  elseif(|level_code|−1 >= 15<<(N−1),
  28-bit escape code:      0000 0000 0000 0001 xxxx xxxx xxxs,
    where   value of x's =   (|level_code|−1) − (15<<(N−1)),
             s =              sign bit(0-positive, 1-negative), where "level_code" is the level information to be decoded from the plurality of tables.

14. The system according to claim 1, wherein one of the plurality of tables is Lev-VLC1 as:

| | Lev-VLC1 | |
|---|---|---|
| Code no | Code (bitstream bits) | Coefficient Level (LevelCode) |
| 0–1 | 1s | ±1 |
| 2–3 | 01s | ±2 |
| ... | ... | ... |
| 28–29 | 000000000000001s | ±15 |
| 30—> | 0000000000000001xxxxxxxxxxxs | ±16—>. |

15. The system according to claim 1, wherein one of the plurality of tables is Lev-VLC2 as:

Lev-VLC2

| Code no | Code (bitstream bits) | Coefficient Level (LevelCode) |
|---|---|---|
| 0–3 | 1xs | ±1 to ±2 |
| 4–7 | 01xs | ±3 to ±4 |
| ... | ... | ... |
| 56–59 | 000000000000001xs | ±29 to ±30 |
| 60—> | 0000000000000001xxxxxxxxxxxs | ±31—>. |

16. The system according to claim 1, wherein one the of the plurality of tables is Lev-VLC3 as:

Lev-VLC3

| Code no | Code (bitstream bits) | Coefficient Level (LevelCode) |
|---|---|---|
| 0–7 | 1xxs | ±1 to ±4 |
| 8–16 | 01xxs | ±5 to ±8 |
| ... | ... | ... |
| 112–119 | 000000000000001xxs | ±57 to ±60 |
| 120—> | 0000000000000001xxxxxxxxxxxs | ±61—>. |

17. The system according to claim 1, wherein one the of the plurality of tables is Lev-VLC4 as:

Lev-VLC4

| Code no | Code (bitstream bits) | Coefficient Level (LevelCode) |
|---|---|---|
| 0–15 | 1xxxs | ±1 to ±8 |
| 16–31 | 01xxxs | ±9 to ±16 |
| ... | ... | ... |
| 224–239 | 000000000000001xxxs | ±113 to ±120 |
| 240—> | 0000000000000001xxxxxxxxxxxs | ±121—>. |

18. The system according to claim 1, wherein one the of the plurality of tables is Lev-VLC5 as:

Lev-VLC5

| Code no | Code (bitstream bits) | Coefficient Level (LevelCode) |
|---|---|---|
| 0–31 | 1xxxxs | ±1 to ±16 |
| 32–63 | 01xxxxs | ±17 to 32 |
| ... | ... | ... |
| 448–479 | 000000000000001xxxxs | ±225 to ±240 |
| 480—> | 0000000000000001xxxxxxxxxxxs | ±241—>. |

19. The system according to claim 1, wherein one the of the plurality of tables is Lev-VLC6 as:

Lev-VLC6

| Code no | Code (bitstream bits) | Coefficient Level (LevelCode) |
|---|---|---|
| 0–63 | 1xxxxxs | ±1 to ±32 |
| 64–127 | 01xxxxxs | ±33 to ±64 |
| ... | ... | ... |
| 896–959 | 000000000000001xxxxxs | ±449 to ±480 |
| 960 –> | 0000000000000001xxxxxxxxxxxs | ±481 –>. |

20. The system according to claim 1, wherein an initial table separate from the plurality of tables is Lev-VLC0 as

Lev-VLC0

| Code (bitstream bits) | Coefficient Level (LevelCode) |
|---|---|
| 1 | 1 |
| 01 | −1 |
| ... | ... |
| 00000000000001 | −7 |
| 000000000000001xxs | ±8 to ±15 |
| 0000000000000001xxxxxxxxxxxs | ±16 –>. |

21. The system according to claim 1, wherein the single escape sequence is 28 bit long.

22. The system according to claim 1, wherein the tables having the single escape sequence are tables Lev-VLC1, Lev-VLC2, Lev-VLC3, Lev-VLC4, Lev-VLC5, Lev-VLC6.

23. A Context-Adaptive Variable Length Coding (CAVLC) method for decoding transform coefficient levels, the method comprising the step of:

a) receiving a bitstream including context-adaptive variable-length-encoded Run_before and Coefficient_level data corresponding to quantized transform coefficients;

b) accessing a plurality of decoding tables for decoding the data, wherein at least two of the decoding tables have a single escape sequence and are generated by a common function; and c) selecting one of the plurality of tables for decoding the Coefficient_level data.

* * * * *